United States Patent
Shabbir et al.

(10) Patent No.: US 10,827,651 B2
(45) Date of Patent: Nov. 3, 2020

(54) AIRFLOW CHARACTERIZATION SYSTEM

(71) Applicant: Dell Products L.P., Round Rock, TX (US)

(72) Inventors: Hasnain Shabbir, Round Rock, TX (US); Dominick Adam Lovicott, Jarrell, TX (US); Carlos Guillermo Henry, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 278 days.

(21) Appl. No.: 16/046,427

(22) Filed: Jul. 26, 2018

(65) Prior Publication Data

US 2020/0037464 A1 Jan. 30, 2020

(51) Int. Cl.
*H05K 7/20* (2006.01)

(52) U.S. Cl.
CPC ......... *H05K 7/207* (2013.01); *H05K 7/20563* (2013.01)

(58) Field of Classification Search
CPC .................... H05K 7/207; H05K 7/20563
See application file for complete search history.

(56) References Cited

U.S. PATENT DOCUMENTS

| | | | |
|---|---|---|---|
| 2008/0198896 A1* | 8/2008 | Nair | H05K 7/207 374/141 |
| 2010/0139360 A1* | 6/2010 | Gross | G01F 1/6965 73/1.16 |
| 2018/0003532 A1* | 1/2018 | Vanberg | F24D 19/10 |

* cited by examiner

*Primary Examiner* — Manuel L Barbee
(74) *Attorney, Agent, or Firm* — Haynes and Boone, LLP

(57) ABSTRACT

An airflow characterization system includes a first airflow sensor subsystem positioned at a first location on an airflow characterization board base and a second airflow sensor subsystem positioned at a second location on the airflow characterization board base that is different than the first location. An airflow characterization controller is coupled to the first airflow sensor subsystem and the second airflow sensor subsystem. When the airflow characterization board is positioned in a circuit board slot, the airflow characterization controller receives a first airflow signal from the first airflow sensor subsystem during a first time period and receives a second airflow signal from the second airflow sensor subsystem during the first time period. The airflow characterization controller determines a circuit board slot airflow characterization for the circuit board slot based on the first airflow signal and the second airflow signal.

20 Claims, 9 Drawing Sheets

AIRFLOW CHARACTERIZATION SYSTEM

BACKGROUND

The present disclosure relates generally to information handling systems, and more particularly to an airflow characterization system to characterize airflow across a circuit board slot in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, servers and storage systems, sometimes include a chassis that houses the components of the system. For example, some servers include a chassis that defines a component enclosure that allows a plurality of circuit boards (e.g., a Peripheral Component Interconnect (PCI) card, a PCI Express (PCIe) card, etc.) to be coupled to the server, often adjacent a rear of the chassis, as well as houses the other server components in the server. Such servers typically draw air for cooling their server components through apertures in the front of the chassis, and expel heated air through apertures in the rear of the chassis. In some embodiments, the component enclosure may house board(s) including a plurality of circuit board slots that are each connected to a circuit board, with each circuit board slot associated with an airflow characterization. For example, based on the position of a circuit board slot in the chassis in relation other server components, that circuit board slot may have an airflow characterization that includes an airflow linear feet per minute (LFM) measurement that is different than that of other circuit board slots in the chassis. Furthermore, circuit boards that are to be housed in the circuit board slots may have different airflow requirements. As such, knowledge of the airflow characterization of a circuit board slot may be desirable so that circuit boards may be housed in circuit board slots that satisfy their airflow requirements, which allows those circuit boards to operate at their desired performance levels.

However, determining airflow characterization of each circuit board slot is a difficult task due to, for example, variations across servers. For example, each server may have a different configuration of components within its chassis, which results in a different airflow characterization for that circuit board slot in each server. In conventional systems, an LFM probe may be used to characterize airflow for any particular circuit board slot. However, such LFM probes are often inaccurate due to, for example, the LFM probe being restricted to measuring airflow velocity at a single point on or adjacent the circuit board slot. Furthermore, other thermal test vehicle (TTV) based options that provide for the determining of airflow characterizations require additional probes (e.g., thermocouples), power supplies to power the TTV to desired power levels for airflow characterization, and instrumentation and software to obtain the airflow velocity reading(s). As such, these TTVs are complex, and may require a relatively large amount of time to obtain an accurate airflow characterization for the circuit board slot(s) in the chassis.

Accordingly, it would be desirable to provide an improved airflow characterization system.

SUMMARY

According to one embodiment, an Information Handling System (IHS) includes a server chassis defining an chassis enclosure that includes a circuit board slot; and an airflow characterization board provided in the circuit board slot, wherein the airflow characterization board includes: a first airflow sensor subsystem positioned at a first location on the airflow characterization board base; a second airflow sensor subsystem positioned at a second location on the airflow characterization board base that is different than the first location; and an airflow characterization controller that is coupled to the first airflow sensor subsystem and the second airflow sensor subsystem, and wherein the airflow characterization controller is configured to; receive a first airflow signal from the first airflow sensor subsystem during a first time period; receive a second airflow signal from the second airflow sensor subsystem during the first time period; and determine, based on the first airflow signal and the second airflow signal, a circuit board slot airflow characterization for the circuit board slot.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
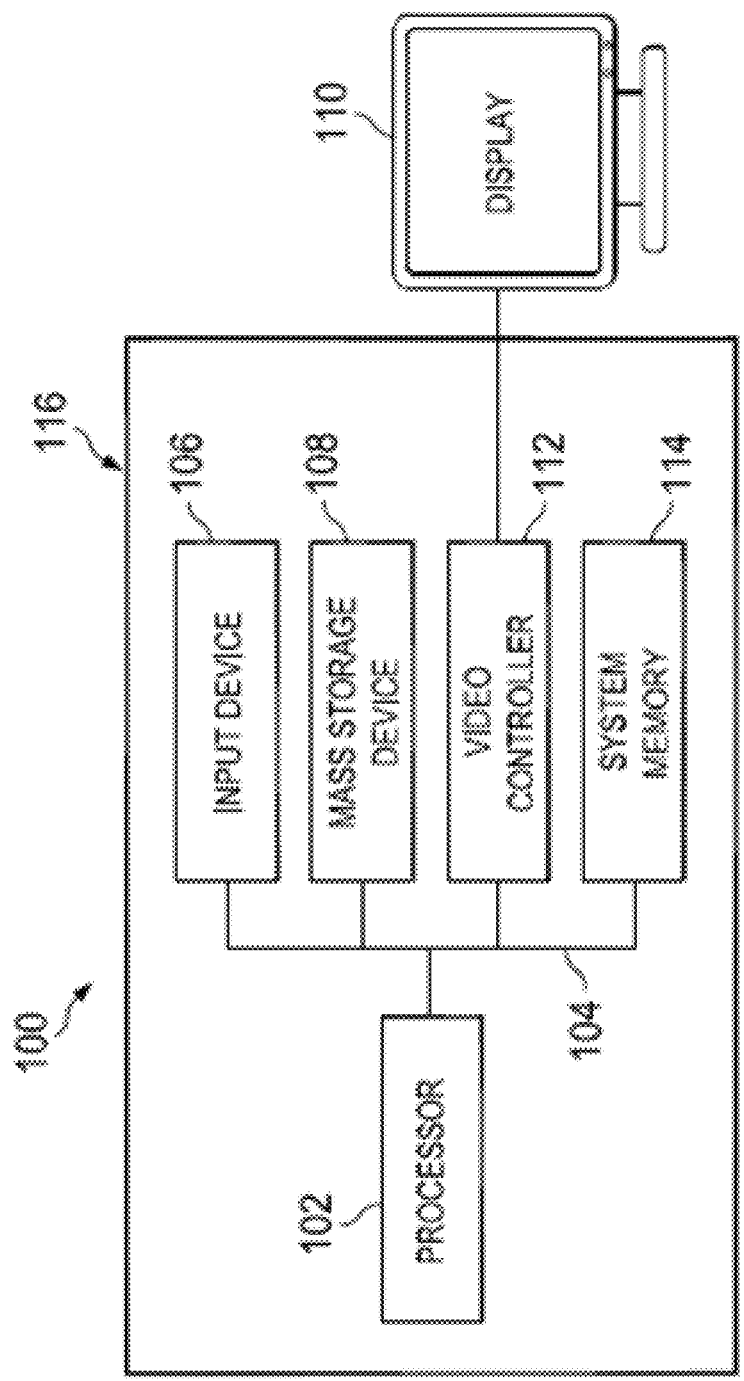
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
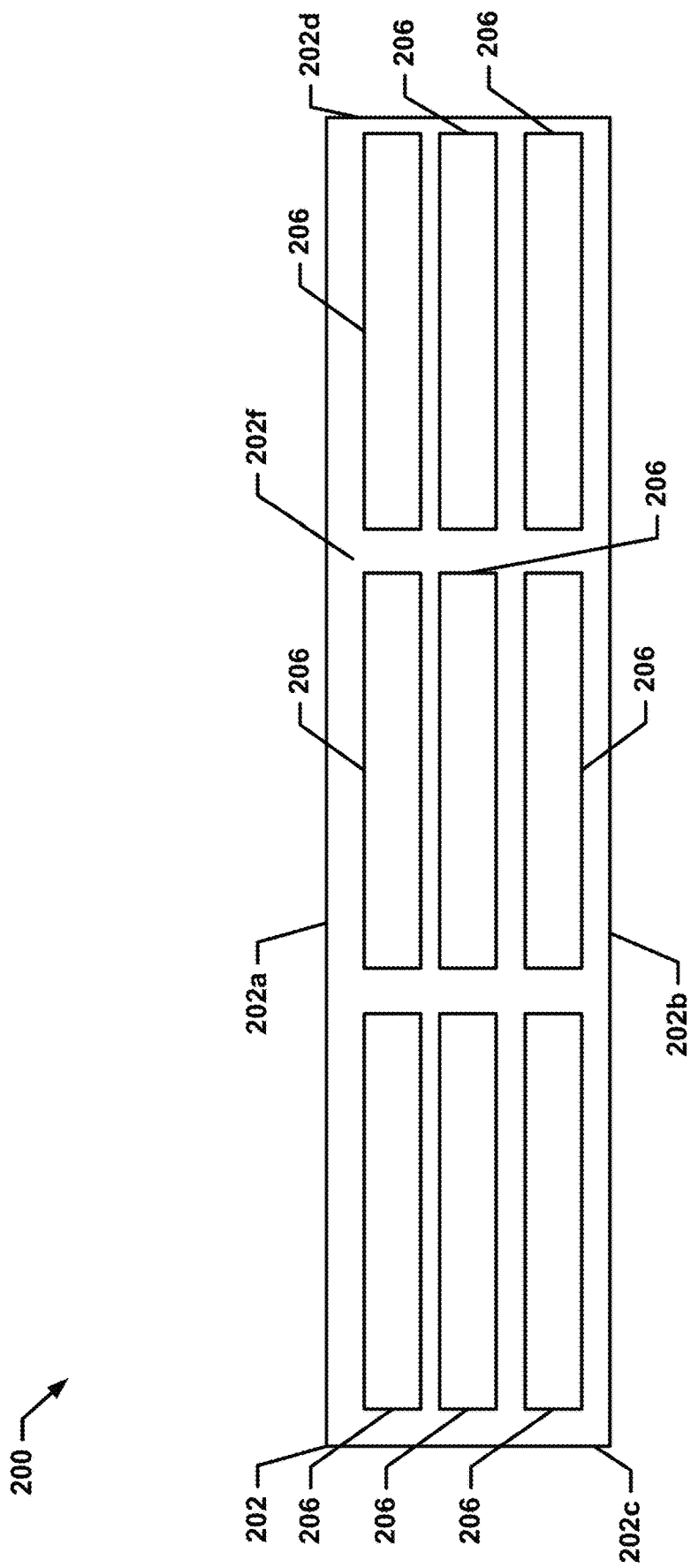
FIG. 2A is a rear view illustrating an embodiment of a component chassis.
Figure 2B:
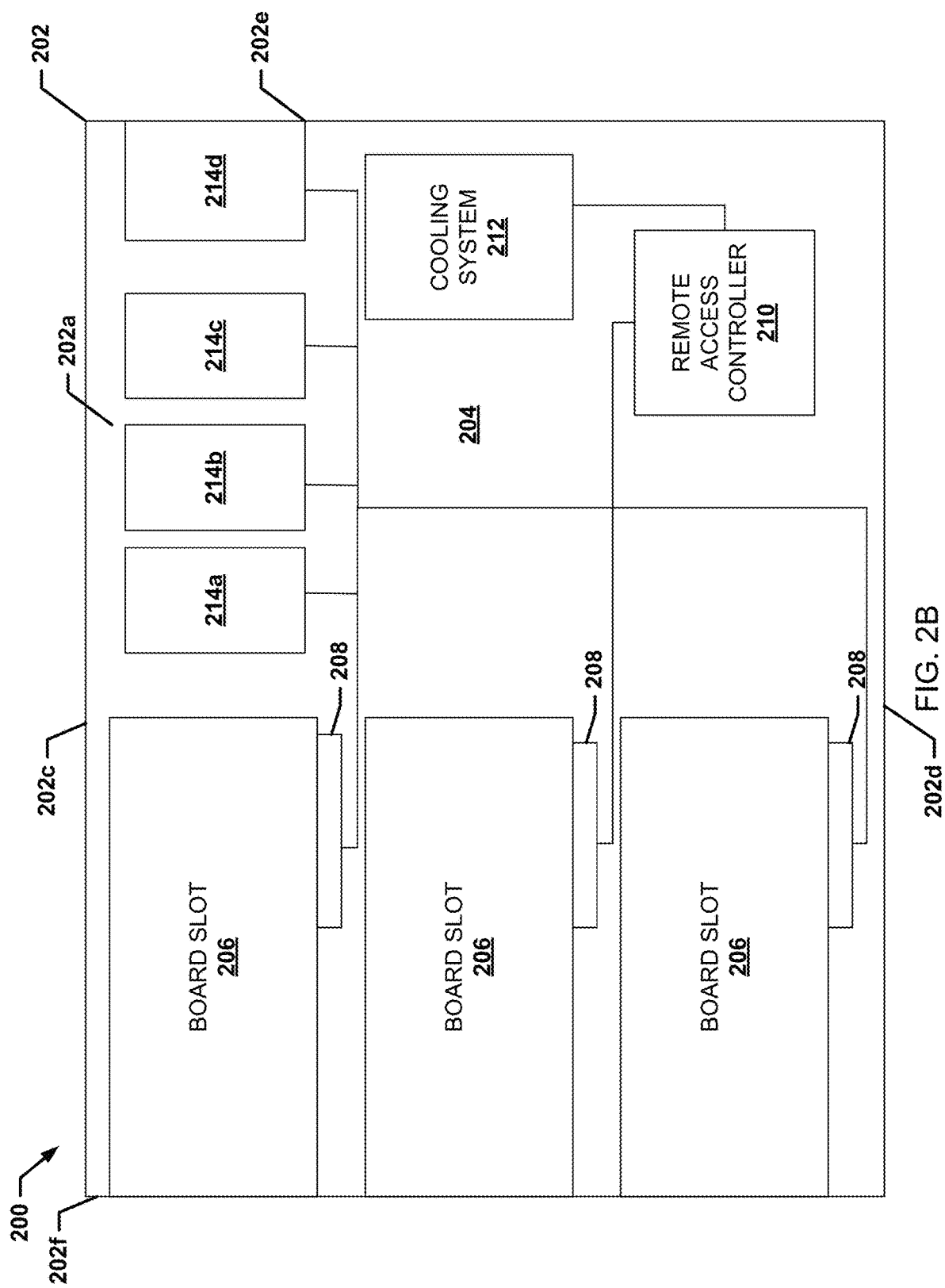
FIG. 2B is a schematic view illustrating an embodiment of the component chassis of FIG. 2A

Referring now to FIGS. 2A and 2B, an embodiment of a component chassis 200 is illustrated that may be the chassis 116 discussed above with reference to FIG. 1 and, as such, may house some or all of the components of the IHS 100. In the discussions below, the component chassis 200 is a server chassis that houses the components of a server, including a plurality of circuit boards in that server that are located adjacent a rear of the component chassis 200. However, other component chassis configurations will benefit from the teachings of the present disclosure and thus are envisioned as falling within its scope. The component chassis 200 includes a base 202 having a top wall 202a, a bottom wall 202b located opposite the component chassis 200 from the top wall 202a, a plurality of side walls 202c and 202d located opposite the component chassis 200 from each other and extending between the top wall 202a and the bottom wall 202b, a front wall 202e extending between the top wall 202a, the bottom wall 202b, and the side walls 202c and 202d, and a rear wall 202f located opposite the component chassis 200 from the front wall 202e and extending between the top wall 202a, the bottom wall 202b, and the side walls 202c and 202d. A chassis enclosure 204 is defined between the top wall 202a, the bottom wall 202b, the side walls 202c and 202d, the front wall 202e, and the rear wall 202f. In the illustrated embodiment, the chassis enclosure 204 includes a plurality of circuit board slots 206 that are located adjacent the rear wall 202f. In the illustrated embodiment, the component chassis 200 provides three columns that each include three circuit board slots, but other numbers and configurations of circuit board slots are envisioned as falling within the scope of the present disclosure as well. One of skill in the art in possession of the present disclosure will recognize that a variety of coupling, securing, and/or guiding features may be provided adjacent the circuit board slots for coupling, securing, and/or guiding circuit boards and/or other components into the circuit board slots 206, and may be replaced or supplemented with a variety of features that would be apparent to one of skill in the art in possession of the present disclosure while remaining within the scope of the present disclosure.

The component chassis 200 may house a one or more boards (not illustrated) that may include a baseboard, a riser board, a backplane, and/or other board structures that may be provided adjacent the plurality of circuit board slots 206 (e.g., opposite the plurality of circuit board slots 206 from the rear wall 202f, perpendicular to the rear wall 202f, etc.). A respective board connector 208 may be provided on the board adjacent each of the plurality of circuit board slots 206 such that circuit boards positioned a circuit board slot may engage that board connector. In a specific example, each respective board connector 208 may be coupled to a remote access controller 210 that may be provided by, for example, an integrated Dell Remote Access Controller (iDRAC) provided by DELL® Inc. of Round Rock, Tex., United States, a baseboard management controller (BMC), and/or any other out-of-band controller that would be apparent to one of skill in the art in possession of the present disclosure. The remote access controller 210 may be coupled to a cooling system 212 that is housed in the component chassis 200 and that is configured to provide airflow through the chassis enclosure 204. One of skill in the art in possession of the present disclosure will recognize that air used for cooling by the cooling system 212 is often drawn in through apertures in the front wall 202e, heated by the components in the chassis enclosure 204, and expelled as heated air through apertures in the rear wall 202f. However, other configurations of cooling systems, airflow intake, and airflow outtake are envisioned as falling within the scope of the present disclosure as well. A plurality of components may be located in the chassis enclosure 204 and may include a processing system 214a, a memory system 214b, a power system 214c, a storage system 214d, and/or any of a variety of other computing components that would be apparent to one of skill in the art in possession of the present disclosure. Furthermore, any or all of the components 208, 210, 212, and/or 214a-f may be coupled to a backplane and/or each other via circuit boards, wired subsystems, wireless subsystems, and/or other coupling subsystems known in the art.

Referring now to FIGS. 3A, 3B, 3C, 3D, and 3E, an embodiment of an airflow characterization board 300 is illustrated. In a specific embodiment, the airflow characterization board 300 may be circuit board configured to couple with a board connector such as the board connectors 208 discussed above with reference to FIG. 2B. The airflow characterization board 300 includes an airflow characterization board base 302 having a top surface 302a, a bottom surface 302b that is located opposite the airflow characterization board base 302 from the top surface 302a, a front edge 302c extending between the top surface 302a and the bottom surface 302b, a rear edge 302d located opposite the airflow characterization board base 302 from the front edge 302c and extending between the top surface 302a and the bottom surface 302b, and a pair of side edges 302e and 302f that are located opposite each other on the airflow characterization board base 302 and that each extend between the top surface 302a, the bottom surface 302b, the front edge 302c, and the rear edge 302d.

A board connector system 304 may be included on the side edge 302f of the airflow characterization board base 302. The board connector system 304 may include at least one board connector such as the board connector 306. In a specific embodiment, the board connector 306 may include an edge connector that is configured to couple with any of the board connectors 208 of FIG. 2B when the airflow characterization board is positioned in the circuit board slot 206 adjacent that board connector 208. As such, the board connector 306 may include a PCI connector, a PCIe connector, an ISA connector, an AGP connector, a VESA connector, an EISA slot, a CNR connector, an AMR connector, a memory connector (e.g., a SIMM connector, DIMM connector, etc.) and/or other connectors that would apparent to one of skill in the art as benefitting from the teachings of the present disclosure. While the board connector system 304 of FIGS. 3A-D includes at least one board connector (i.e., a male connector), one of skill in the art in possession of the present disclosure will recognize that the board connector system 304 may be replaced by a connector receptacle system that includes at least one board connector receptacle (i.e., at least one female connector), or a board connector system that includes both board connector receptacles and board connectors, while remaining within the scope of the present disclosure as well.

In some embodiments, one or more board components may be located on the top surface 302a of the airflow characterization board base 302. For example, the board connector system 304 may be coupled to the board components via a communication bus 308 that is configured to communicate data between the board connector system 304 and the one or more board components and/or a power lane 310. In an embodiment, the airflow characterization board 300 may include a voltage regulator subsystem 312 that is coupled to the power lane 310, and that is configured to regulate and provide power to the board components. For example, the voltage regulator subsystem 312 may receive power from the board connector system 304 and/or an auxiliary power connector 314. In various examples, the voltage regulator subsystem 312 may include a voltage regulator 312a and/or a voltage regulator 312b for providing stable DC voltage (e.g., a 3.3V and/or 12V, respectively, illustrated in FIG. 3B) independent of the load current, temperature, and/or AC line voltage variation.

The airflow characterization board 300 may also include an airflow sensor subsystem 316 that is positioned at a first location on the airflow characterization board base 302, and an airflow sensor subsystem 318 positioned at a second location on the airflow characterization board base 302 that is different than the first location. For example, the airflow sensor subsystem 316 may include a single airflow sensor 320 or an airflow sensors array 322 including a plurality of airflow sensors 320 (illustrated in FIG. 3B). Each airflow sensor 320 may include a system monitor 320a (e.g., a TMP512 and/or a TMP513 temperature and power supply system monitors manufactured by Texas Instruments®, Inc of Dallas, Tex.) that may include local temperature sensor(s) and/or be coupled to a remote temperature sensor 320b (e.g., a PMBT3906VS 40 V, 200 mA PNP/PNP switching transistor of NXP Semiconductors®, Inc of Eindhoven, Netherland), and that may be configured to read a voltage from the remote temperature sensor 320b and communicate that voltage over the communication bus 308. In a specific example, the remote temperature sensor 320b may include a first transistor that generates the voltage, with the level of that voltage based on the temperature generated by a second transistor.

In an embodiment, the airflow sensor subsystem 316 may include a temperature sensor portion 322a provided in the airflow sensor array 322, with a portion of the airflow sensors 320 in the airflow sensor array 322 designated as temperature sensors for generating temperature signals, rather than airflow characterization signals generated by an airflow sensor portion 322b provided in the airflow sensor array 322. For example, the temperature sensor portion 322a provided in the airflow sensor array 322 may be located adjacent the front edge 302c of the airflow characterization board base 302 to measure temperature of an inlet airflow.

Figure 3A:
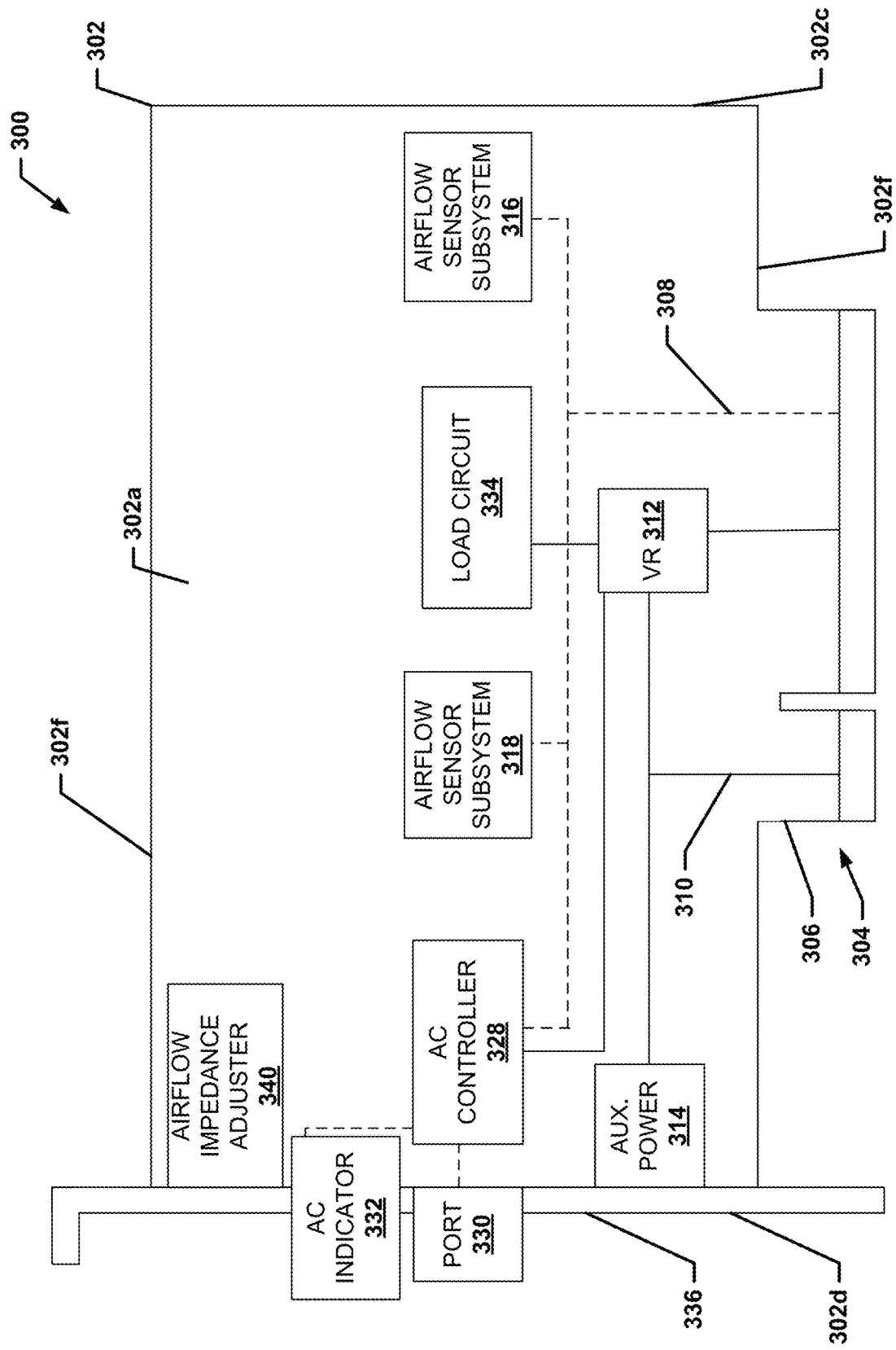
FIG. 3A is a schematic view illustrating an embodiment of an airflow characterization board.
Figure 3B:
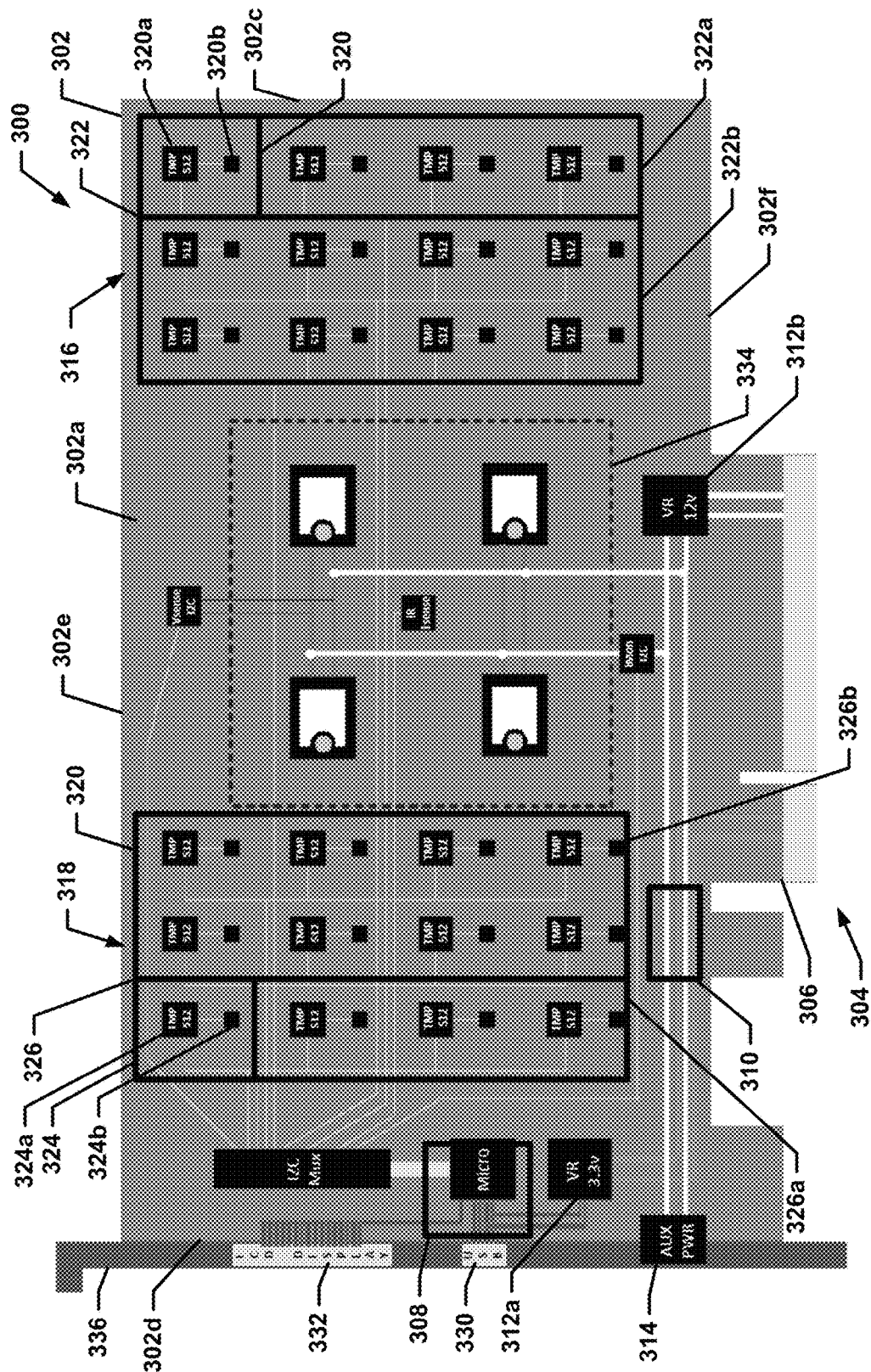
FIG. 3B is a schematic view illustrating an embodiment of the airflow characterization board of FIG. 3A.
Figure 3C:
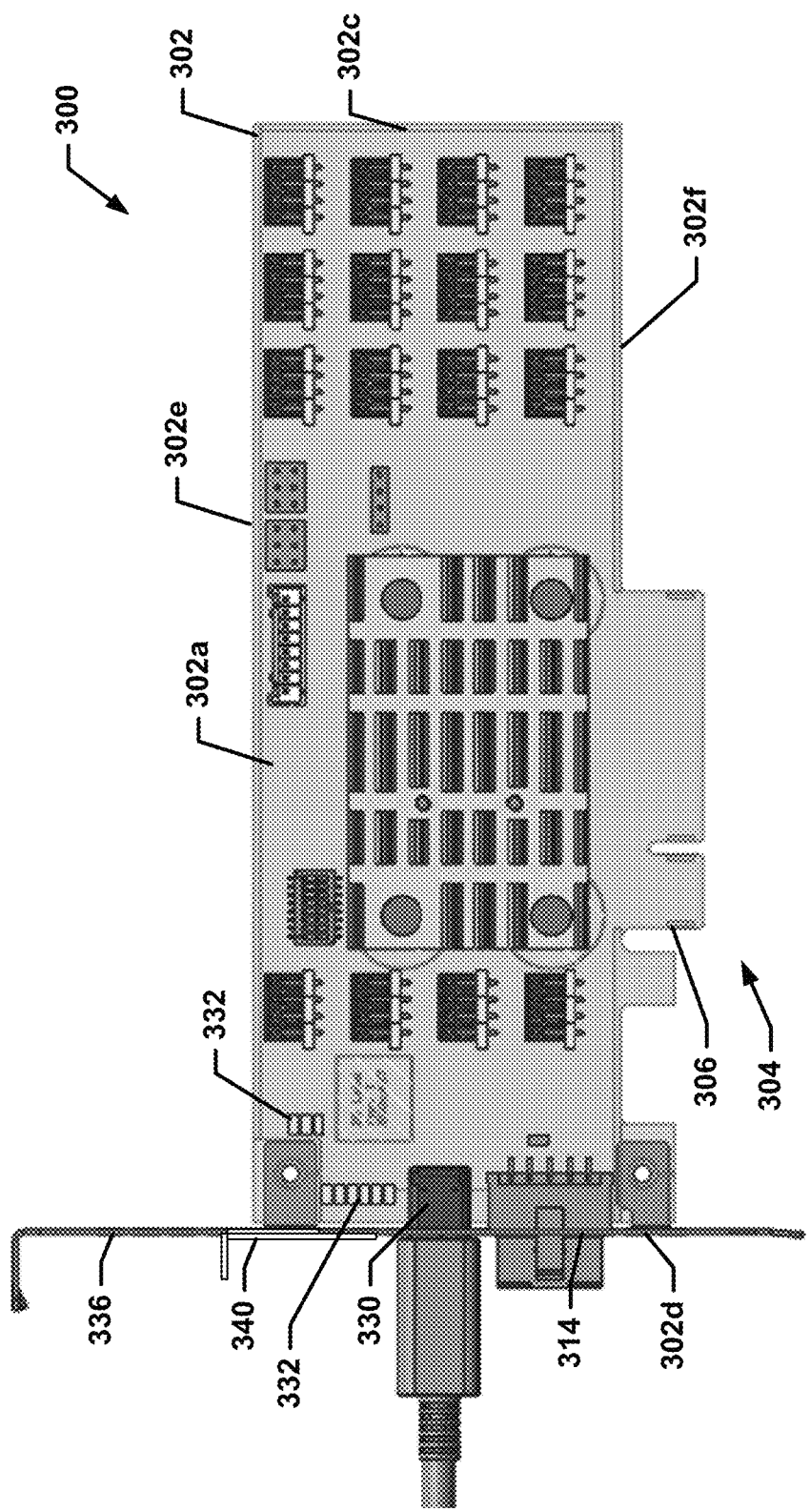
FIG. 3C is a top view illustrating an embodiment of the airflow characterization board of FIG. 3A.
Figure 3E:
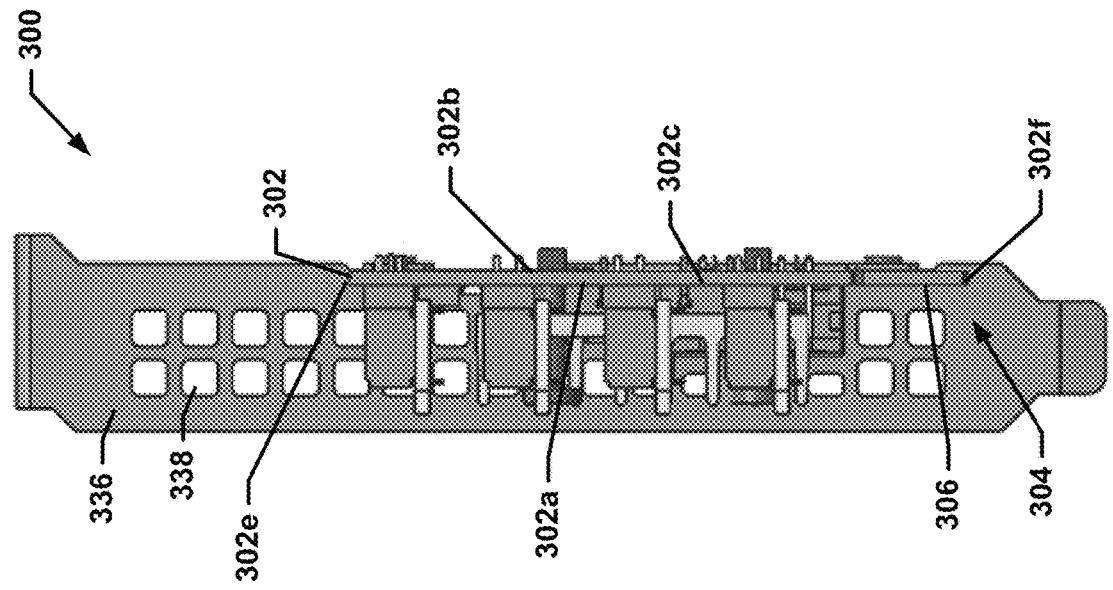
FIG. 3E is a front view illustrating an embodiment of the airflow characterization board of FIG. 3A.
Figure 3D:
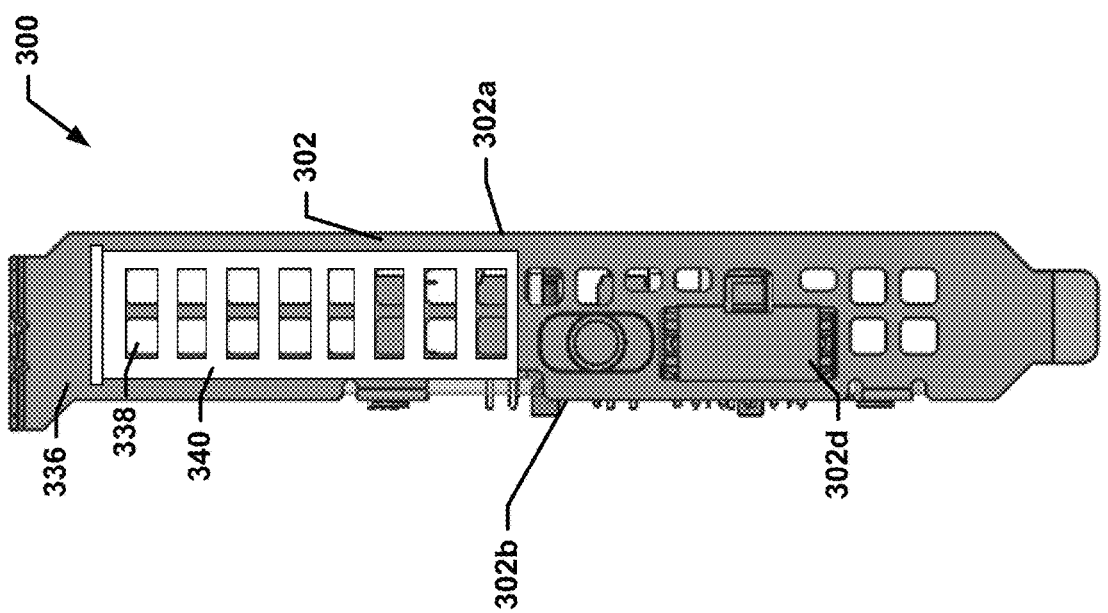
FIG. 3D is a rear view illustrating an embodiment of the airflow characterization board of FIG. 3A.

Similar to the airflow sensor subsystem 316 described above, the airflow sensor subsystem 318 may include a single airflow sensor 324 or an airflow sensors array 326 including a plurality of airflow sensors 324 illustrated in FIG. 3B). Each airflow sensor 324 may include a system monitor 324a (e.g., a TMP512 and/or a TMP513 temperature and power supply system monitors manufactured by Texas Instruments®, Inc of Dallas, Tex.) that may include a local temperature sensor(s) and/or be coupled to a remote temperature sensor 324b (e.g., a PMBT3906VS 40 V, 200 mA PNP/PNP switching transistor of NXP Semiconductors®, Inc of Eindhoven, Netherland), and that may be configured to read a voltage from the remote temperature sensor 324b and communicate that voltage over the communication bus 308. In a specific example, the remote temperature sensor 324b may include a first transistor that generates the voltage, with the level of that voltage based on the temperature generated by a second transistor.

In an embodiment, the airflow sensor subsystem 318 may include a temperature sensor portion 326a provided in the airflow sensor array 326, with a portion of the airflow sensors 324 in the airflow sensor array 326 designated as temperature sensors for generating temperature signals rather than airflow characterization signals generated by an airflow sensor portion 326b provided in the airflow sensor array 326. For example, the temperature sensor portion 326a provided in the airflow sensor array 326 may be located adjacent the rear edge 302d of the airflow characterization board base 302 to measure temperature of an outlet airflow. While a specific examples of airflow sensors 320 and 324 have been illustrated and described above, one of skill in the art in possession of the present disclosure will recognize other airflow sensors and airflow sensor configurations may be provided that will fall within the scope of the present disclosure as well.

The airflow characterization board 300 may also include an airflow characterization controller 328 that is coupled to the airflow sensor subsystem 316 and the airflow sensor subsystem 318, and may be configured to receive airflow characterization signals from the airflow sensor subsystem 316 and the airflow sensor subsystem 318. For example, the communication bus 308 may be a serial bus such as an Inter-Integrated Circuit ($I^2C$) bus that enables such communications between the airflow characterization controller 328 and each of the airflow sensor subsystem 316 and the airflow sensor subsystem 318. However, one of skill in the art would recognize that other communication buses may be provided while remaining within the scope of the present disclosure as well. In an embodiment, the airflow characterization controller 328 may be configured to store, in memory provided on the airflow characterization controller 328, an airflow characterization table that allows the airflow characterization controller 328 to determine an airflow characterization for a circuit board slot 206 in FIG. 2B based on the voltage signals that are received from the airflow sensors subsystems 216 and 218, which may indicate a voltage drop that is proportional to a change in temperature that allows airflow characterizations such as airflow velocity and/or air flow direction to be calculated. In a specific example, the airflow characterization table may be pre-calibrated and loaded onto the airflow characterization controller 328 via an airflow characterization controller port 330 (e.g., a USB port) on the airflow characterization board that is coupled to the airflow characterization controller 328. In another specific example, the airflow characterization controller 328 may be configured to average the airflow characterization at each location of the airflow sensor subsystems 318 and 320 to obtain an airflow characterization for the entire card slot. In other examples, the airflow characterization controller 328 may be configured to determine localized airflow "dead zones", localized high airflow locations, direction of flow, an airflow map, zone based averaging of airflow, as well as overall max and min airflow.

The airflow characterization controller 328 may also be coupled to an airflow characterization indicator 332. For example, the airflow characterization indicator 332 may be provided by one or more Light Emitting Diodes (LEDs) that may be positioned on the rear edge 302d of the airflow characterization board base 302. However, in other examples the airflow characterization indicator 332 may be a Liquid Crystal Display (LCD) display or any other display device that would be apparent to one of skill in the art in possession of the present disclosure, and may be located on the rear edge 302d of the airflow characterization board base 302, or at any of the other faces/edges of the airflow characterization board base 302 as well.

The airflow characterization board 300 may also include a load circuit 334 may be coupled to the power lane 310 and the airflow characterization controller 328. In an embodiment, the load circuit 334 may be configured to generate heat when measuring the airflow characterization in order to, for example, replicate heat produced by a functioning circuit board that is conventionally provided in the circuit board slot 206 of FIGS. 2A and 2B and coupled to the board connector 208. For example, the load circuit 334 may include one or more heat sinks, power resistors, and/or any other heat generating components that would be apparent to one of skill in the art in possession of the present disclosure.

The airflow characterization board 300 may also include a mounting bracket 336 that may be positioned on the rear edge 302d of the airflow characterization board 300. The mounting bracket 336 may be configured to mount the airflow characterization board 300 to the component chassis 200, and may include a plurality of apertures 338 that are configured to allow airflow to enter or exit the circuit board slot 206 in which the airflow characterization board 300 is positioned. In various embodiments, the mounting bracket 336 may include an airflow impedance adjuster device 340 that may be configured to adjust the impedance of the airflow entering and/or exiting the circuit board slot 206. For example, the airflow impedance device 340 may include a venting member or other subsystem that is configured to open and close at least a portion of the plurality of apertures 338 (e.g., via elements that are configured to slide or otherwise move to block airflow through the portion of any of the plurality of apertures 338 in order to achieve a desired airflow impedance.)

Figure 4:
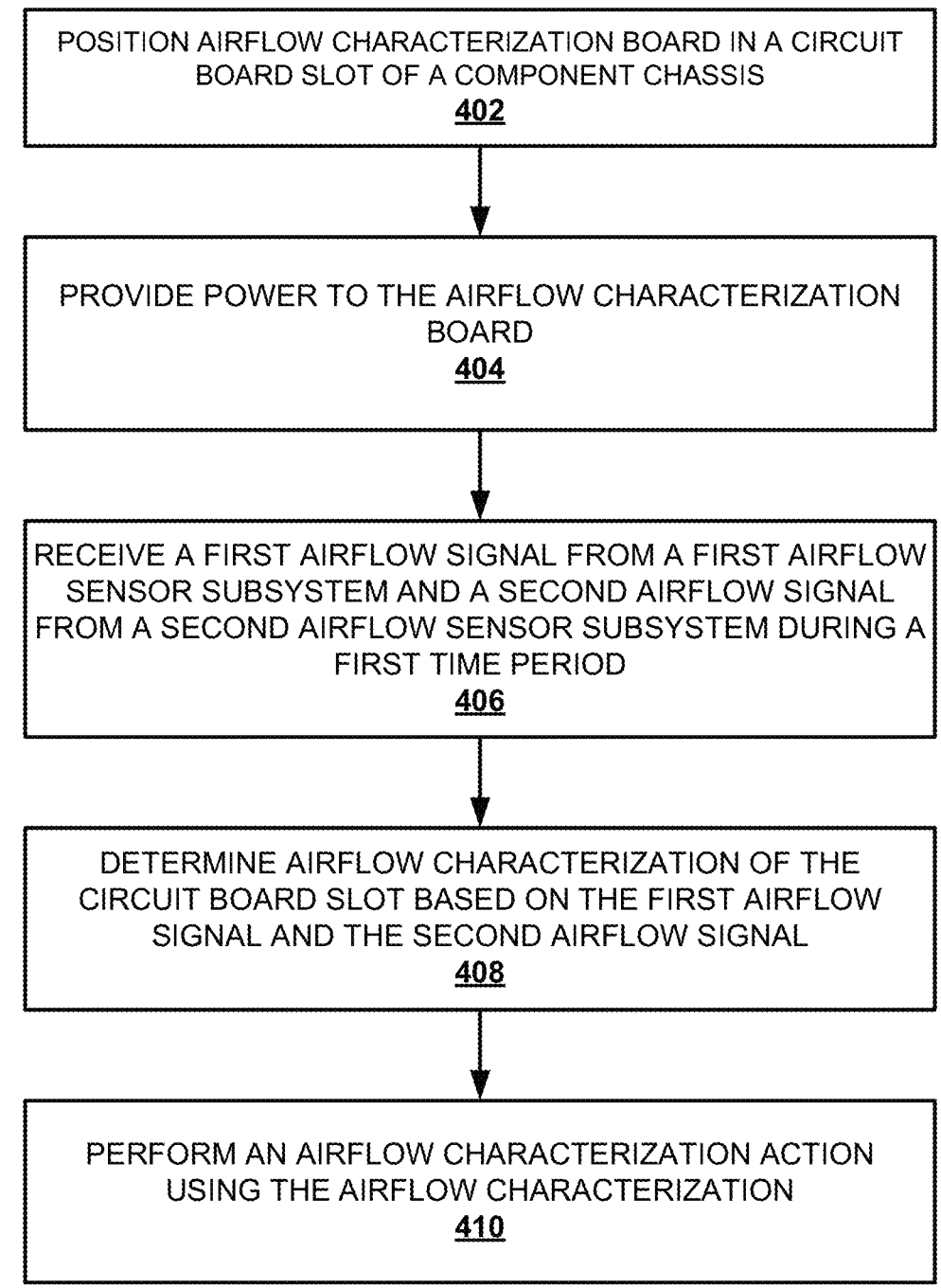
FIG. 4 is a flow chart illustrating an embodiment of a method for characterizing airflow for a circuit board slot.

Referring now to FIG. 4, a method 400 of airflow characterization for a circuit board slot is illustrated. As discussed below, the systems and method of the present disclosure provide a component chassis and an airflow characterization board that may be positioned into a circuit board slot defined by the component chassis and operated to determine an airflow characterization of that circuit board slot that may include airflow velocity (e.g., LFM, CFM), air flow direction, temperature, and/or any other airflow characterization information that would be apparent to one of skill in the art in possession of the present disclosure. Airflow sensor subsystems are provided on an airflow characterization board base, which allows the airflow characterization board to more accurately measure airflow characterizations compared to conventional single point airflow velocity probes. Furthermore, the airflow characterization board is less complex and provides quicker airflow characterization relative to conventional thermal test vehicles (TTVs) that are used to characterize airflow adjacent circuit board slots. By providing an airflow characterization controller on the airflow characterization card rather than via the external testing devices coupled to probes that use external power supplies as is done with conventional TTVs, an airflow characterization controller may provide airflow characterizations for a circuit board slot to an airflow characterization indicator device provided on the airflow characterization board, and/or to a remote access controller housed in the component chassis.

Figure 5:
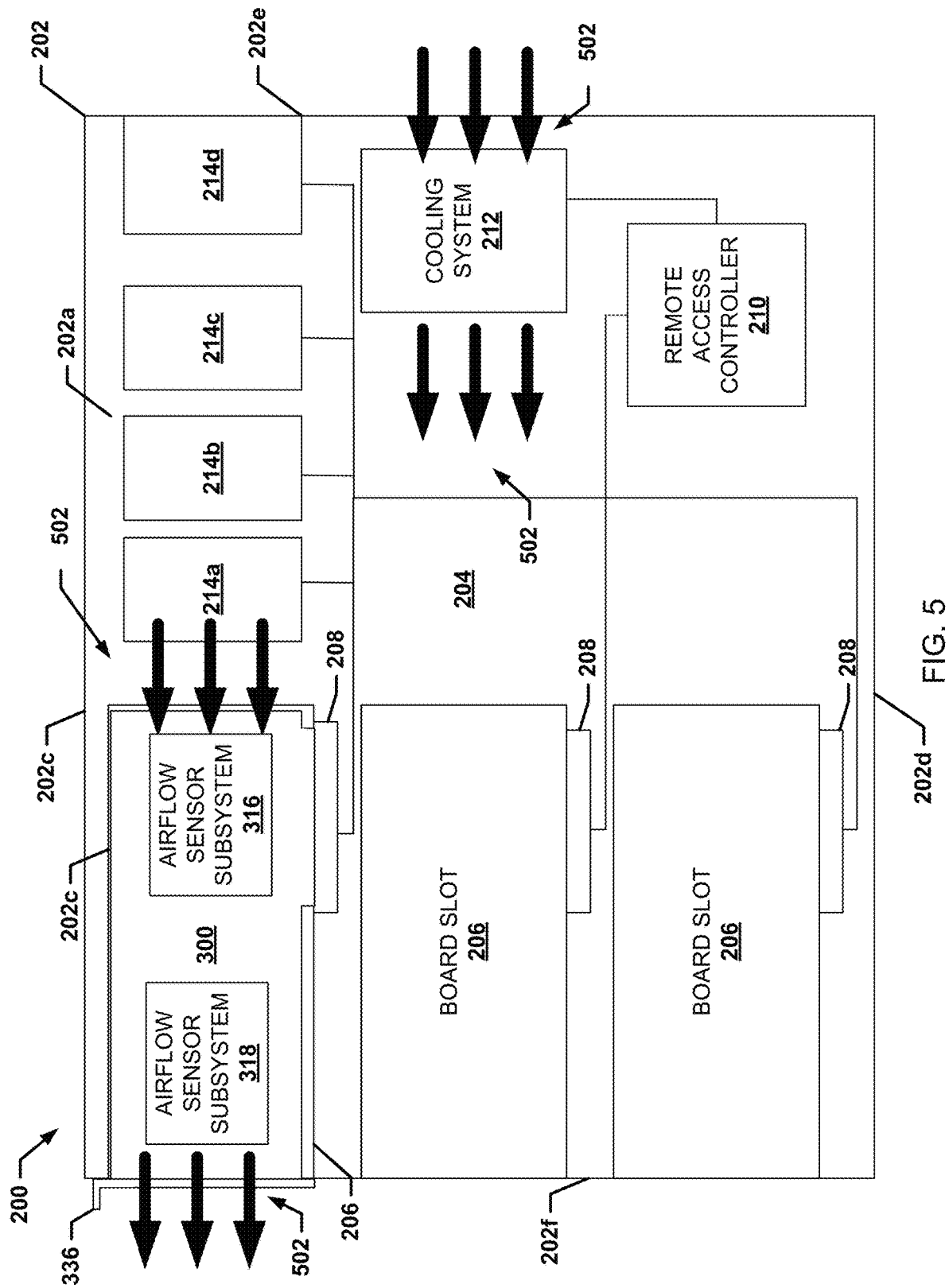
FIG. 5 is a schematic view illustrating an embodiment of the airflow characterization board of FIGS. 3A-3E positioned in a circuit board slot of the component chassis of FIGS. 2A-2B.

The method 400 begins at block 402 where an airflow characterization board is positioned in a circuit board slot of a component chassis. In an embodiment of block 402 and with reference to FIG. 5, the airflow characterization board 300 may be positioned in a circuit board slot 206 of the component chassis 200. In some examples, the airflow characterization board 300 may be positioned in the circuit board slot 206 without coupling the board connector system 304 on the airflow characterization board 300 to the board connector 208. However, in other examples, the airflow characterization board 300 may be connected with the board connector 208 via the board connector system 304 the airflow characterization board 300. In such examples, the board connector system 304 the airflow characterization board 300 may be connected with the board connector 208 mechanically and/or electrically such that data and/or power may be transmitted between the board connector 208 and the board connector system 304.

The method 400 may then proceed to block 404 where power is provided to the airflow characterization board. In an embodiment of block 404, if the board connector system 304 is connected with the board connector 208, the airflow characterization board 300 may receive power from a power supply coupled to the board connector 208. However, if the board connector 208 is not receiving power, and/or the board connector system 304 is not connected to the board connector 208, the airflow characterization board 300 may receive power from an auxiliary power source that is coupled to the auxiliary power connector 314. Power provided to the airflow characterization board 300 at block 404 may be controlled by the voltage regulator subsystem 312. For example, as illustrated in FIG. 3B, the airflow characterization board may receive power amounts of 12V and/or 3.3V, and in some embodiments, the voltage regulator subsystem 312 may provide 3.3V to the airflow sensor subsystems 316 and 318.

The method 400 may then proceed to block 406 where a first airflow signal from the first airflow sensor subsystem and a second airflow signal from the second airflow sensor subsystem are received during a first time period. In an embodiment of block 406 and referring to FIG. 5, the cooling system 212 may be activated and may provide airflow 502 through the component chassis 200. In the illustrated embodiment, the airflow 502 enters the circuit board slot 206 while moving through the component chassis 200 in a direction from the front wall 202e to the rear wall 202f. However, one of skill in the art would recognize that the airflow 502 may be in any direction while remaining within the scope of the present disclosure. As the airflow 502 passes the airflow sensor subsystem 316 and the airflow sensor subsystem 318, the airflow sensor subsystem 316 may generate and provide a first airflow signal to the airflow characterization controller 328, while the airflow sensor subsystem 318 may generate and provide a second airflow signal to the airflow characterization controller 328. For example, each airflow sensor 320 of the airflow sensor subsystem 316, and each airflow sensor 324 of the airflow sensor subsystem 318, may provide airflow signals to the airflow characterization controller 328 such as, for example, a sensed voltage drop that is proportional to a change in temperature detected at each airflow sensor 320 and/or 322 as the airflow 502 passes over those airflow sensors. As discussed above, the airflow signals from each airflow sensors 320 and/or 322 may be provided over an I²C bus that provides the communication bus 308.

In various embodiments, the remote access controller 210 may detect that the airflow characterization board 300 is coupled to the board connector 208. In some examples in which the cooling system 212 is an active cooling system rather than a passive cooling system, upon detecting the presence of the airflow characterization board 300, the remote access controller 210 may cause the cooling system 212 to provide a series of cooling levels. For example, if the cooling system 212 is a fan system, the remote access controller 210 may cause the cooling system 212 to operate at various fan speeds to cause the airflow 502 to vary such that the airflow characterization for each fan speed may be obtained, as discussed below.

The method 400 may then proceed to block 408 where airflow characterization of the circuit board slot is determined based on the first airflow signal and the second airflow signal. In an embodiment of block 406 and referring to FIG. 5, the airflow characterization controller 328 may determine the airflow characterization for the circuit board slot 206 using the first airflow signal and the second airflow signal. For example, the airflow characterization controller 328 may be programmed (e.g., via the airflow characterization controller port 330) with airflow characterization correlations and/or other coefficients, and the airflow characterization controller 328 may be configured to use those airflow characterization correlations/coefficients to determine the airflow characterization for the circuit board slot based on the airflow signals received from the airflow sensor subsystems 316 and/or 318. For example, the airflow characterization correlations may include an airflow characterization such as airflow velocity (e.g., LFM and/or CFM) for a particular voltage drop indicated by a signal from the airflow sensor subsystems 316 and/or 318, which may allow the airflow characterization controller 328 to generate an airflow characterization profile for any given time period to allow an airflow characterization for each location on the airflow characterization board base that includes an airflow sensor 320 and/or 324 to be provided in an airflow characterization profile. In other examples, the airflow characterization controller 328 may average the airflow characterization for each airflow sensor subsystems 316 and/or 318 to provide an airflow characterization for the circuit board slot 206 that includes the average of the airflow characterization for each airflow sensor subsystem 316 and/or 318. In addition to airflow velocity, the airflow characterization controller 328 may determine a path of the airflow 502 based on the locations of the airflow sensor subsystems 316 and 318 on the airflow characterization board 300, an airflow velocity and/or temperature for any given time period indicated by the signals from the airflow sensor subsystems 316 and 318, and/or any other airflow characterization information that would be apparent to one of skill in the art in possession of the present disclosure.

The method 400 may then proceed to block 410 where the airflow characterization of the circuit board slot is used to perform an airflow characterization action. In an embodiment of block 410, the airflow characterization controller 328 may provide the airflow characterization to the airflow characterization indicator 332. For example, the airflow characterization controller 328 may provide the airflow characterization to the LED's included in the airflow characterization indicator 332, and those LED's may illuminate to indicate an average airflow velocity in a binary format that can be read by an administrator. In another example, the airflow characterization controller 328 may provide the airflow characterization to software logging functions provided on an external device that is connected to the airflow characterization controller port 330. In another example, the airflow characterization controller 328 may provide the airflow characterization to a display device that is coupled to the component chassis 200 or the airflow characterization board 300. In yet another example, the airflow characterization controller 328 may provide the airflow characterization to the remote access controller 210 when the remote access controller 210 is causing the cooling system 212 to provide the series of cooling levels discussed above, and the remote access controller 210 may store the airflow characterization of the circuit board slot 206 for each cooling level that is provided. as such, when all of the cooling levels have been provided and an airflow characterization has been associated with those cooling levels, the airflow characterization board 300 may be removed from the circuit board slot 206 and provided in another of the circuit board slot(s) defined by the component chassis 200 so that the remote access controller 210 may obtain the airflow characterization for the various cooling levels provided by the cooling system 212 for any circuit board slot in the component chassis 200.

In various embodiments, the load circuit 334 may be activated to generate heat during the first time period. As discussed above, the load circuit 334 may be used to generate heat that a conventional circuit board would generate when provided in the circuit board slot 206, which allows the airflow characterization controller 328 to obtain a more accurate airflow characterization for the circuit board slot 206 due to the airflow characterization board 300 providing conditions that are similar to what the circuit board slot 206 will experience when a conventional circuit board is operating in the circuit board slot 206. Similarly, the airflow impedance device 340 may be adjusted such that the airflow characterization board 300 provides an airflow impedance that is similar to the airflow impedance that would be present in the circuit board slot 206 when a conventional circuit board is operating in the circuit board slot. One of skill in the art in possession of the present disclosure will recognize that providing the airflow impedance that represents actual conditions that will be experienced in the circuit board slot may result in a more accurate airflow characterization measurement for that circuit board slot.

Thus, systems and methods have been described that provide for airflow characterization of a circuit board slot in a component chassis by providing an airflow characterization board that includes airflow sensor subsystems that provide at least two airflow sensors positioned at different locations on the airflow characterization board, and that generate airflow sensors signals that an airflow characterization controller may use to determine the airflow characterization for the circuit board slot. For example, the airflow characterization controller may determine airflow velocity, airflow temperature, and/or airflow direction for the circuit board slot, and provide that airflow characterization to an airflow characterization indicator included on the airflow characterization board so that additional monitoring hardware and software is not required to obtain the airflow characterization of the circuit board slot. Furthermore, the airflow characterization controller may provide airflow characterization(s) to a remote access controller for use in cooling system control. As such, the airflow characterization board may provide a more accurate airflow characterization for the entire circuit board slot than is available with conventional air velocity probes and thermal test vehicles. Furthermore, the airflow characterization board reduces the complexity and test times associated with conventional thermal test vehicles that require probes, additional power supplies, and monitoring hardware and software to obtain airflow characterizations.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An airflow characterization system, comprising:
an airflow characterization board base;
a first board connector that is coupled to the airflow characterization board base and that is configured to connect to a second board connector located adjacent a circuit board slot;
a first airflow sensor subsystem positioned at a first location on the airflow characterization board base;
a second airflow sensor subsystem positioned at a second location on the airflow characterization board base that is different than the first location; and
an airflow characterization controller that is coupled to the first airflow sensor subsystem and the second airflow sensor subsystem, and wherein the airflow characterization controller is configured, when the airflow characterization board base is positioned in the circuit board slot, to:
receive a first airflow signal from the first airflow sensor subsystem during a first time period;
receive a second airflow signal from the second airflow sensor subsystem during the first time period; and
determine, based on the first airflow signal and the second airflow signal, a circuit board slot airflow characterization for the circuit board slot.

2. The airflow characterization system of claim 1, further comprising:
a load circuit provided on the airflow characterization board base and coupled to the airflow characterization controller, wherein the airflow characterization controller is configured to:
cause the load circuit to generate heat during the first time period.

3. The airflow characterization system of claim 1, further comprising:
an auxiliary power connector coupled to the airflow characterization controller, wherein the auxiliary power connector is configured to provide power to the airflow characterization controller when coupled with an auxiliary power source.

4. The airflow characterization system of claim 1, further comprising:
an airflow characterization indicator coupled to the airflow characterization controller, wherein the airflow characterization indicator is configured to provide an indication of the circuit board slot airflow characterization.

5. The airflow characterization system of claim 1, further comprising:
an airflow impedance device coupled to the airflow characterization board base, wherein the airflow impedance device is configured to adjust an airflow impedance provided by the airflow characterization board base.

6. The airflow characterization system of claim 1, wherein the circuit board slot airflow characterization includes an average airflow velocity for the circuit board slot.

7. The airflow characterization system of claim 6, wherein the circuit board slot airflow characterization includes an airflow direction.

8. The airflow characterization system of claim 1, wherein the first airflow sensor subsystem includes a first array of airflow sensors and the second airflow sensor subsystem includes a second array of airflow sensors, wherein a portion of the airflow sensors in the first array are configured as temperature sensors and positioned on the airflow characterization board base adjacent an airflow outlet when the airflow characterization board base is provided in the circuit board slot, and a portion of the airflow sensors in the second array are configured as temperature sensors and positioned on the airflow characterization board base adjacent an airflow inlet when the airflow characterization board base is provided in the circuit board slot, wherein the airflow characterization controller is configured to:
receive first temperature signals from the first array of airflow sensors during the first time period; and
receive second temperature signals from the second array of airflow sensors during the first time period.

9. The airflow characterization system of claim 1, wherein the airflow characterization controller is further configured to:
provide the circuit board slot airflow characterization through the first board connector to a remote access controller that is coupled to the second board connector and that is configured to store the circuit board slot airflow characterization.

10. An Information Handling System (IHS), comprising:
a server chassis defining an chassis enclosure that includes a circuit board slot; and an airflow characterization board provided in the circuit board slot, wherein the airflow characterization board includes:
- a first airflow sensor subsystem positioned at a first location on the airflow characterization board;
- a second airflow sensor subsystem positioned at a second location on the airflow characterization board that is different than the first location; and
- an airflow characterization controller that is coupled to the first airflow sensor subsystem and the second airflow sensor subsystem, and wherein the airflow characterization controller is configured to;
  - receive a first airflow signal from the first airflow sensor subsystem during a first time period;
  - receive a second airflow signal from the second airflow sensor subsystem during the first time period; and
  - determine, based on the first airflow signal and the second airflow signal, a circuit board slot airflow characterization for the circuit board slot.

11. The IHS of claim 10, further comprising:
a first board connector that is provided in the circuit board slot, and wherein the airflow characterization board includes a second board connector that is coupled to the first board connector when the airflow characterization board is provided in the circuit board slot.

12. The IHS of claim 11, wherein the first board connector provides power to the airflow characterization board.

13. The IHS of claim 11, further comprising:
a remote access controller coupled to the first board connector, wherein the airflow characterization controller is further configured to:
provide the circuit board slot airflow characterization to the remote access controller, wherein the remote access controller is configured to store the circuit board slot airflow characterization.

14. The IHS of claim 10, further comprising:
a cooling system provided in the chassis enclosure, wherein the cooling system provides airflow to the circuit board slot during the first time period.

15. The IHS of claim 10, wherein the airflow characterization board further includes:
an auxiliary power connector coupled to the airflow characterization controller, wherein the auxiliary power connector is configured to provide power to the airflow characterization controller when coupled with an auxiliary power source.

16. The IHS of claim 10, wherein the airflow characterization board further includes:
an airflow characterization indicator coupled to the airflow characterization controller, wherein the airflow characterization controller is configured to provide an indication of the circuit board slot airflow characterization on the airflow characterization indicator.

17. An airflow characterization method, comprising:
receiving, by an airflow characterization controller provided on an airflow characterization board that is positioned in a circuit board slot defined by a server chassis, a first airflow signal from a first airflow sensor subsystem during a first time period;
receiving, by the airflow characterization controller, a second airflow signal from a second airflow sensor subsystem during the first time period; and
determining, by the airflow characterization controller, based on the first airflow signal and the second airflow signal, a circuit board slot airflow characterization for the circuit board slot.

18. The method of claim 17, further comprising:
receiving, by the airflow characterization controller, power from a first board connector provided on the airflow characterization board that is coupled to a second board connector positioned in the circuit board slot defined by the server chassis.

19. The method of claim 17, further comprising:
providing, by the airflow characterization controller, the circuit board slot airflow characterization to a remote access controller via a first board connector provided on the airflow characterization board that is coupled to a second board connector positioned in the circuit board slot defined by the server chassis, wherein the remote access controller is coupled to the second board connector.

20. The method of claim 17, further comprising:
providing, by the airflow characterization controller, an indication of the circuit board slot airflow characterization on an airflow characterization indicator provided on the airflow characterization board.

* * * * *